United States Patent [19]

Natori et al.

[11] 4,243,997

[45] Jan. 6, 1981

[54] SEMICONDUCTOR DEVICE

[75] Inventors: Kenji Natori, Kamakura; Fujio Masuoka, Yokohama, both of Japan

[73] Assignee: Tokyo Shibaura Electric Co., Ltd., Japan

[21] Appl. No.: 955,879

[22] Filed: Oct. 30, 1978

Related U.S. Application Data

[63] Continuation of Ser. No. 781,382, Mar. 25, 1977, abandoned.

[30] Foreign Application Priority Data

| Mar. 25, 1976 | [JP] | Japan | 51/31932 |
| Mar. 25, 1976 | [JP] | Japan | 51/31933 |
| Jul. 10, 1976 | [JP] | Japan | 51/81487 |

[51] Int. Cl.³ .......................................... H01L 27/78
[52] U.S. Cl. ........................................ 357/23; 357/22; 357/55; 357/56; 357/58; 357/90
[58] Field of Search .................... 357/23, 22, 55, 56, 357/58, 90

[56] References Cited

U.S. PATENT DOCUMENTS

| 3,975,221 | 8/1976 | Rodgers | 357/23 |
| 4,003,126 | 1/1977 | Holmes et al. | 357/23 |

OTHER PUBLICATIONS

Ames et al.-IBM Tech. Bul.-vol. 9, No. 1, Jun. 1976.

*Primary Examiner*—Edward J. Wojciechowicz
*Attorney, Agent, or Firm*—Finnegan, Henderson, Farabow, Garrett & Dunner

[57] ABSTRACT

The first and second intrinsic semiconductor layers of thickness d are formed on a P type semiconductor substrate, keeping a prescribed interval therebetween, whereby a groove of depth d may be made between these layers. A dielectric layer is formed in such a way that it may cover a base and sides of the groove and a surface of the intrinsic semiconductor layer. On this surface, a gate electrode formed of polysilicon exists. Diffusion regions of a source and a drain of depths $X_{sj}$ and $X_{dj}$ are formed, in the neighborhood of groove sides, in the first and second intrinsic semiconductor layers ($X_{sj}$, $X_{dj}$ d), resulting in an MOS transistor.

12 Claims, 38 Drawing Figures

SEMICONDUCTOR DEVICE

This is a continuation application Ser. No. 781,382, filed 3/25/77, now abandoned.

BACKGROUND OF THE INVENTION

This invention relates to a semiconductor device such as an MOS transistor which shortens the essential channel length by forming a groove.

A tendency toward an integration of high density, and toward a high speed operation of MOS IC, necessitates a considerable miniaturization of the individual MOS transistors forming the IC.

The shortening of so-called channel length between regions of source and drain of MOS transistors is desirable in order to reduce the volume of the MOS transistor and the electrostatic capacity of the gate portion, thus increasing the operation speed. When the channel length L between the source and drain regions is sufficiently large in comparison with diffusion depths $X_j$ of the source and drain regions and the breadth of depletion layer, an equipotential line becomes approximately parallel to the substrate surfaces, and the operation of the MOS transistor is stable, not depending upon the channel length L or the diffusion depth of $X_j$; however, when a channel length becomes equal or less than $5\mu$ and extends to the diffusion depths $X_j$ of the source and drain regions and to the breadth of the depletion layer, the equipotential lines in the channel becomes distorted and its distribution depends upon the depth $X_j$ of diffusion of the source and drain regions and the breadth of depletion layer. In consequence, a threshold value of voltage Vth allowing the source and drain regions to conduct by means of applying voltage Vth to the gate electrode, decreases with a reduction of the channel length and a small scatter of the channel length causes a big dispersion of the threshold voltage Vth.

Even more so, the said equipotential line ends up by depending upon the diffusion depths $X_j$ of the source and drain regions and the voltage applied to the drain, and it is liable to produce a punch through between the source and drain regions, due to the effect of short channel. In order to deal with this kind of problem, diffusion depths $X_j$ of the source and drain regions may be minimized. However, the manufacture of an MOS transistor with small $X_j$ causes other problems, such as difficulties of heat treatment and penetration, the drop of the breakdown voltage at a p-n junction in the neighborhood of a semiconductor substrate and the increase of sheet or surface resistances of diffusion area of the source and drain.

Instability and difficulty of such operation characteristics are big obstacles in the manufacture of IC of higher integrality.

SUMMARY OF THE INVENTION

Therefore, the first object of this invention is to provide a semiconductor device composed in such a way as to have a high density and high integrality but tends to prevent trouble arising from a short channel effect.

The second object of the invention is to provide an MOS transistor of smaller size and of higher stability by composing it in such a way that a channel portion is limited to only the bottom of a groove.

The third object of the invention aims at an MOS transistor composed in such a way that problems resulting from the structure of a source portion of the MOS transistor may be solved without creating conventional problems due to a short channel effect.

DETAILED DESCRIPTION OF THE INVENTION

Figure 1:
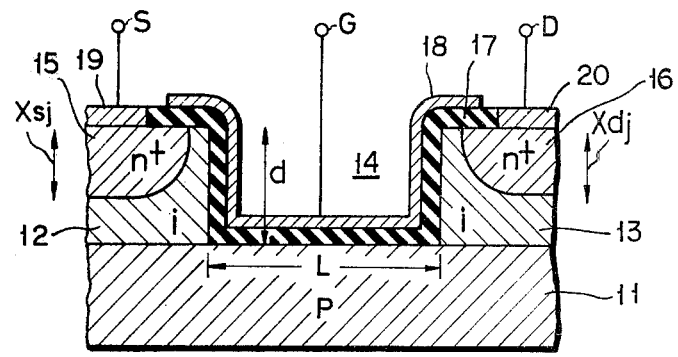
FIG. 1 is a cross sectional view of an MOS transistor in accordance with one embodiment of the invention.

In FIG. 1, two intrinsic semiconductor layers 12 and 13 of thickness d, being separated from each other by a distance L, are placed on a P type semiconductor substrate 11, which results in a groove 14 having a depth d and a breadth L between the intrinsic semiconductor layers 12 and 13.

n+ diffusion regions 15 and 16 are formed in the semiconductor layers 12 and 13 respectively used as a source diffusion region of depth $X_{sj}$ and a drain diffusion region of depth $x_{dj}$.

Here, the depths $X_{sj}$ and $X_{dj}$ respectively of the source and drain regions 15 and 16 are formed so as to be less than the depth d of the groove 14.

A film of $SiO_2$ 17 as a dielectric layer of substantially uniform thickness is formed on a part of the surfaces of the intrinsic semiconductor layers 12 and 13 coming in contact with the bottom and sides of the groove 14. On a surface of the $SiO_2$ film 17, there exists a gate electrode 18 made of polysilicon.

On the said diffusion regions of source and drains 15, 16, a source electrode 19 and a drain electrode 20 are formed by a conventional wiring technique and thus an MOS transistor is completed.

Figure 2A:
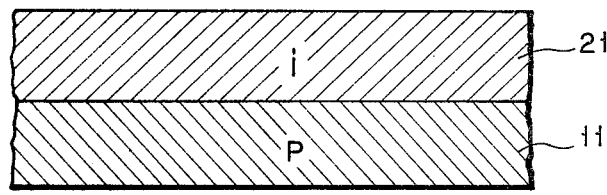
FIGS. 2A to 2F are cross sectional views of the elements per process for explanation of the manufacturing method of the MOS transistor shown in FIG. 1.
Figure 2B:
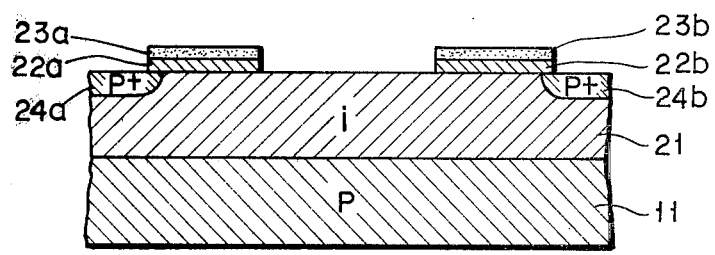

In FIG. 1, S, G and D represent respectively terminals of a source, a gate and a drain. Next, one example of manufacturing process of the MOS transistor in FIG. 1 is explained by referring to FIG. 2A to FIG. 2F. As shown in FIG. 2A, an intrinsic semiconductor layer 21 of thickness of about $1.2\mu$ is formed by an ion implantation process on the surface of a P type semiconductor layer 11. The semiconductor layer 21 may be made with an epitaxial growth method. A concentration of impurity of the semiconductor layer 11 is about $5 \times 10^{15}/cm^3$. In the process of FIG. 2B, silicon oxide layers 22a and 22b and $Si_3N_4$ layers 22a and 23b are formed at appointed places of the source and drain separated from each other by a distance $2\mu$ on the intrinsic semiconductor layer 21. Moreover, p+ regions 24a and 24b of impurity concentration of about $10^{18}/cm^3$ are made in the semiconductor layer 21.

Figure 2C:
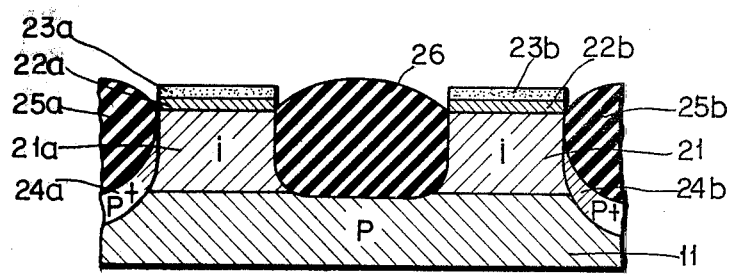
Figure 2D:
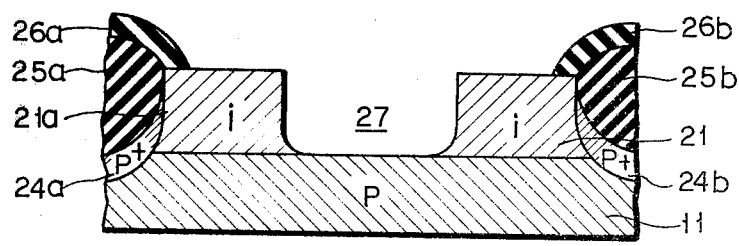
Figure 2E:
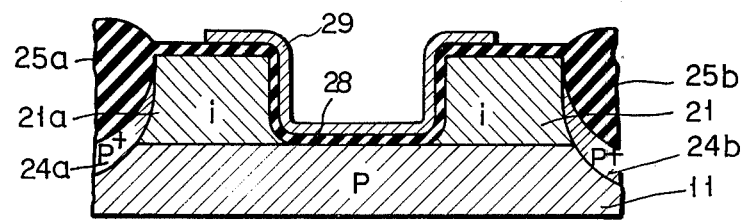

Next, in the process of FIG. 2C, SiO$_2$ layers 25a, 25b and 26, depth about 2.0μ, are formed on the P+ regions 24a, and 24b by heat treating the element of FIG. 2B in an oxidizing atmosphere. Following this, in the process of FIG. 2D, after forming resist films 26a and 26b only on the SiO$_2$ layers 25a and 25b, the SiO$_2$ layer 26 is removed by etching, and a groove 27 of breadth about 2μ and of depth about 1.2μ is formed on the P type semiconductor substrate 11.

Since the thickness of the intrinsic semiconductor layers 21 and 21a is about 1.2μ, the surface of the semiconductor substrate 11 is just exposed on the bottom of the groove 27. Next, in the process of FIG. 2E, the resist films 26a and 26b are removed, and then a SiO$_2$ layer 28 of thickness about 0.1μ as a whole is formed, on which a gate electrode 29 of over all length about 3.5μ, made of polysilicon is formed. At last, in the process of FIG. 2F, the source 15 and drain 16 regions are formed, whose diffusion depths X$_{sj}$ and X$_{dj}$ from the surfaces of the intrinsic semiconductor layers 21 and 21a are respectively about 0.5μ.

Figure 2F:
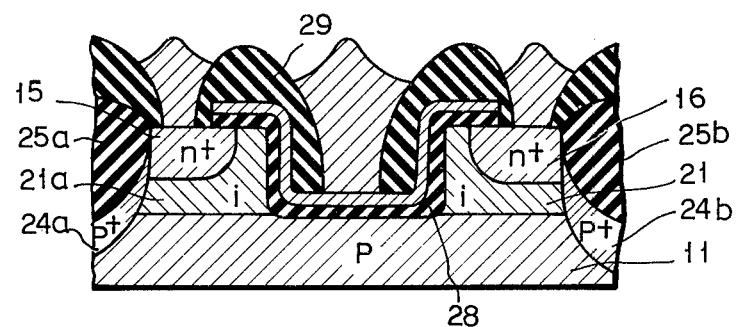

In the process of FIG. 2F, the source and drain regions 15, 16 are formed in such a manner that an n type impurity is diffused into the intrinsic semiconductor layers 21 and 21a at the portion where the SiO$_2$ film 28 is removed. The concentration of the n type impurity is about $10^{19}/cm^3$.

Hereafter, following a conventional production process, setting of electrode and passivation, the manufacturing process of the MOS transistor is completed, Moreover, in this example, first of all, the intrinsic semiconductor layer 21 was formed on the semiconductor substrate 11, but it may be possible to shift a period of formation of the intrinsic semiconductor layer 21 to the stage of processes of FIG. 2B and FIG. 2C by making use of an ion implantation method, and it is also possible to apply a choiced epitaxial growth process for production.

Figure 3:
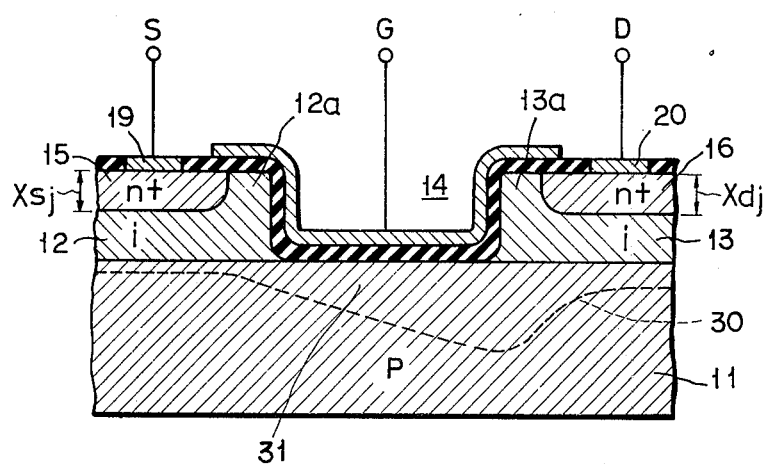
FIG. 3 is a drawing showing a distribution of the depletion layer of the MOS transistor shown in FIG. 1.

FIG. 3 shows a schematic drawing of a distribution of depletion layer at a time of operation of the MOS transistor shown in FIG. 1. In FIG. 3, since the intrinsic semiconductor layers 12, 12a, 13 and 13a exist between the diffusion region of the source 15 and drain 16 and the P type semiconductor substrate 11, a part of the depletion layer 30 constituted in the substrate 11 under the areas of the source 15 and drain and 16 will have a very narrow breadth and, being interdependent on the effect of this special structure forms a channel 31 at the bottom of the groove 14. The depletion layer 30, due to the location of the source and drain 15 and 16 proves to be effective to prevent the creation of a short channel effect.

Moreover, since thickness variations of the depletion layer just under the drain region 16 in respect to a variation of drain voltage are smaller than is the case when an intrinsic semiconductor layer is not provided between the substrate 11 and the drain region 16, this embodiment proves to be effective to decrease the short channel effects of dependence on a drain voltage for a value of the threshold voltage Vth. In the structure of FIG. 3, the channel 31 encloses the groove 14 and it looks as if it has a large length of channel, but in actuality the channel 31 is not so large. Since an inversion layer is formed at the semiconductor dielectric boundary, the threshold voltage Vth to be applied to the gate presents a much smaller value in the case of using intrinsic semiconductor layers 12 and 13 than in the case of only using the P type substrate 11 portion. Accordingly, the intrinsic semiconductor layer-portions 12a, 13a are formed, respectively, with sufficiently thick inversion layers with respect to the gate voltage permitting the formation of an inversion layer at the P type portion 31 right below the groove 14. For this reason, the effective channel portion wherein the current is to be controlled by the gate voltage is limited only to the portion 31 of the P type substrate surface right below the gate.

Another merit of providing the intrinsic semiconductor layers (12, 12a) and (13, 13a) between the P type substrate 11 and the drain region 16, respectively, is that such provision enables an increase in the breakdown voltage at the p-n junctions between the P type substrate 11 and the n type source region 15 and between the P type substrate 11 and the drain region 16. Especially, a decline of the breakdown voltage when reducing the depths X$_{sj}$ and X$_{dj}$ of diffusion regions 15 and 16 can be well avoided.

In relation to this, without bringing upon a decline of breakdown voltage of said p-n junction, it is possible to elevate a concentration of impurity of the P type substrate 11.

This fact is linked with a reduction of the breadth of the depletion layer and shows that a whole body of MOS transistor may be miniaturized, without introducing the short channel effect.

Furthermore, by means of holding an intrinsic semiconductor layer, that is, a semiconductor layer of high resistance 12 and 13 between the regions of source and drain 15 and 16 and the substrate 11, the electrostatic capacity at the p-n junction can be reduced.

This is useful for speeding up of the whole IC composed of MOS transistors.

Several embodiments of the invention can be considered, besides the said embodiments. They are explained in referring to FIG. 4 to FIG. 12. Same reference numerals are applied to the same parts as FIG. 1 and FIG. 3. First of all, in the embodiments of FIG. 1 and FIG. 3, the case of $X_{sj}=X_{dj}$ is considered, and it is a matter of course to obtain a smaller effect in case of $X_{sj}\neq X_{dj}$.

Figure 4:
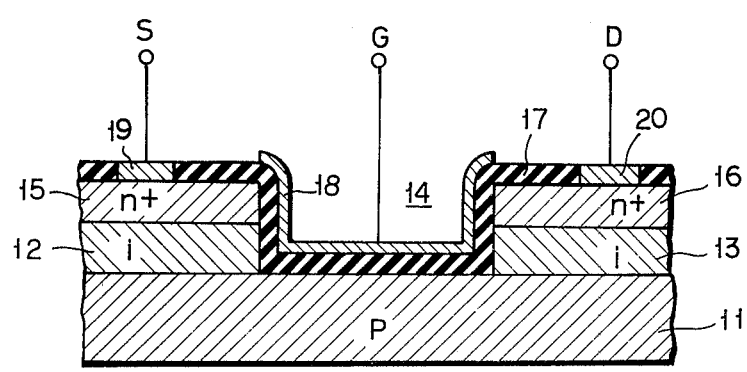
FIGS. 4 to 12 are cross sectional views showing different embodiments of the invention.

In the structure of the device shown in FIG. 3, the intrinsic semiconductor layers 12a and 13a are provided in neighborhood of the both sides of groove 14, but as shown in FIG. 4, a similar effectiveness can be obtained, even for structures having no said portions 12a nor 13a, only with the intrinsic semiconductor layers 12 and 13 of uniform thickness.

Figure 5:
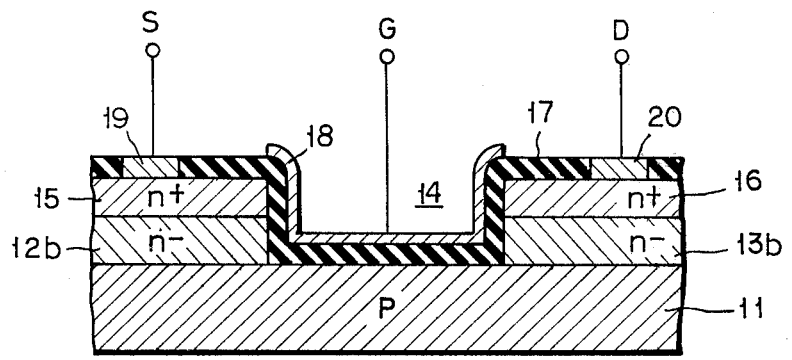
Figure 6:
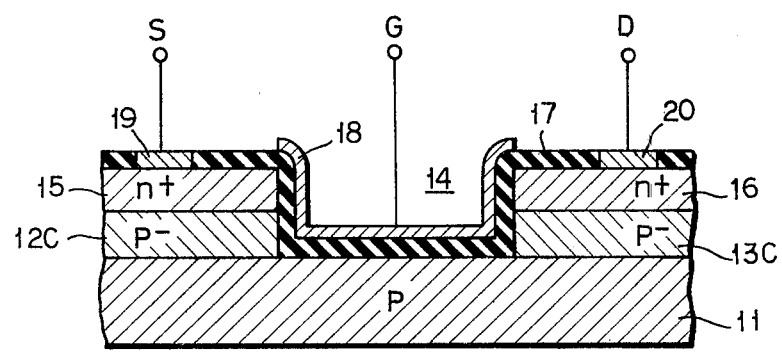
Figure 7:
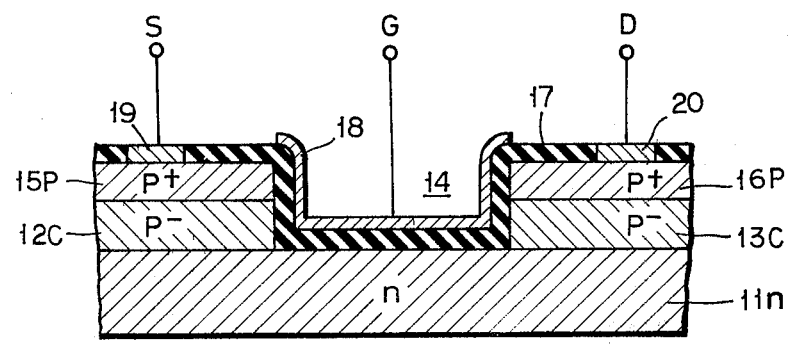
Figure 8:
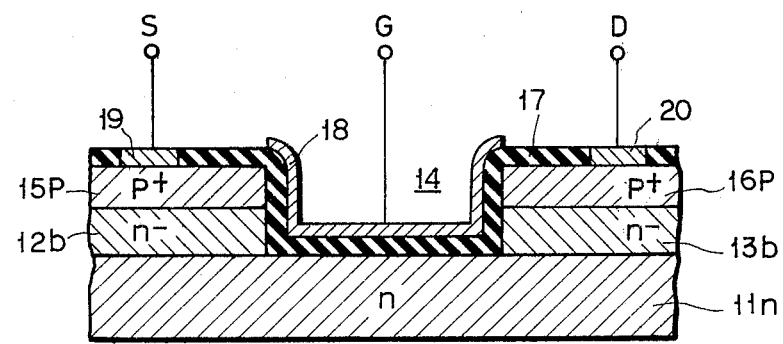
Figure 9:
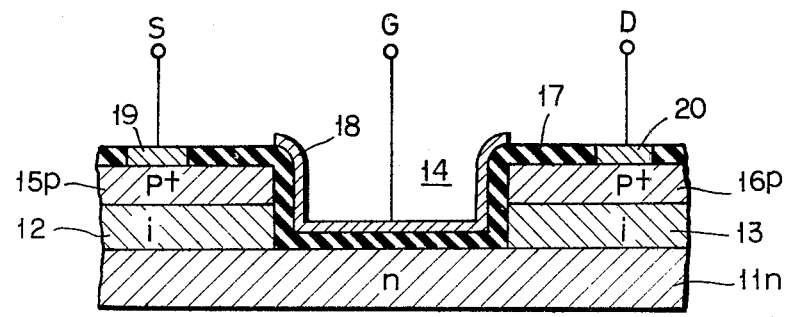

Moreover, as shown in FIG. 5, a similar effect has been obtained by holding n$^-$ layers 12b and 13b of very low concentration of impurity between the regions of source and drain and the P type substrate 11 in place of the intrinsic semiconductor layers 12 and 13. Needless to say, a similar enforcement can be carried out by making use of P layers 12C and 13c, as shown in FIG. 6, in place of n$^-$ layers 12b and 13b. In each said embodiment, an MOS transistor of n channel has been described, but a whole similar operation can be carried out in case of an MOS transistor of P channel. FIG. 7, FIG. 8 and FIG. 9 show each embodiment in this case, namely, the embodiment of FIG. 7 consists of semiconductor layers 12c and 13c of P type between the substrate of n type 11n and the regions of source and drain of P+ type 15p and 16p. The embodiment of FIG. 8 consists of semiconductor layers of n$^-$ type 12b and 13b between the substrate of n type 11n and the regions of source and drain 15p and 16p. The embodiment of FIG.

Figure 10:
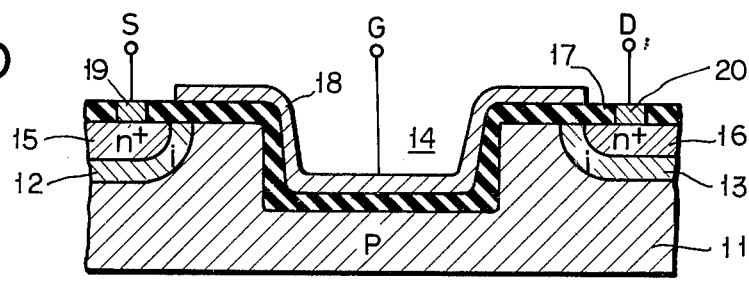

9 is formed by holding the intrinsic semiconductor layers 12 and 13 between the substrate of n type 11n and the regions of source and drain of P+ type 15p and 16p. Every embodiment is an MOS transistor of P channel and its operation is similar to the case of the said embodiments. The embodiment of FIG. 10 is surrounded by the intrinsic semiconductor layers 12 and 13 round the regions of source and drain of n+ type and other compositions; operations are similar to those of the embodiment of FIG. 3.

Figure 11:
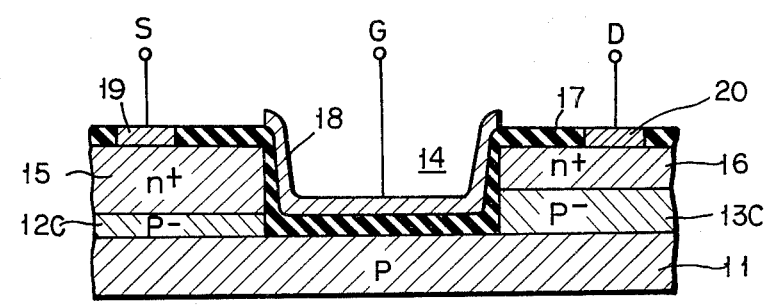

The embodiment of FIG. 11 shows the case of high resistive layer of P− type 13c at the drain side thicker than the layer at source side 12c and the source region 15 is formed thicker than the drain region 16. The embodiment of FIG. 12 is provided with a high resistive layer 13c of p− type only at the side of drain and the region of source 15 is formed so as to be directly adjacent to the P type substrate.

Figure 12:
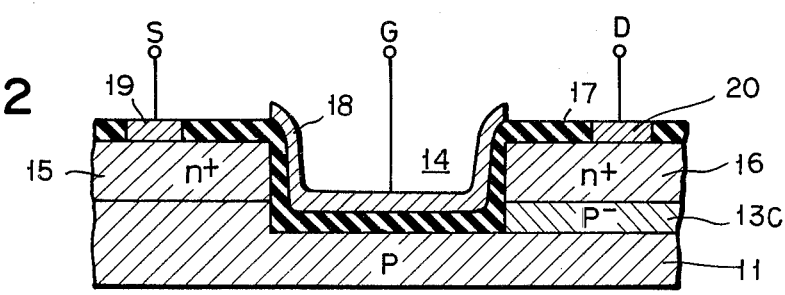

Similar effectiveness can be obtained with the embodiments of FIG. 11 and FIG. 12.

Figure 13:
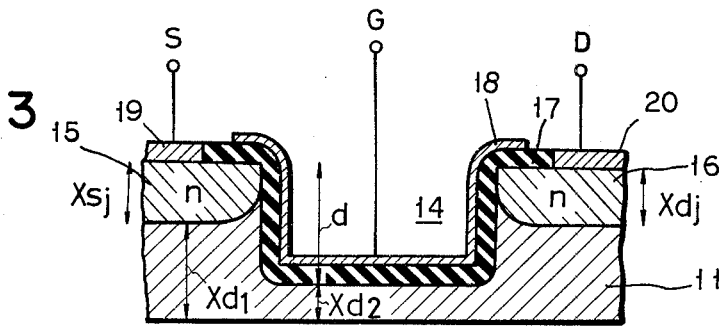
FIG. 13 is a cross sectional view of another embodiment of the invention.

In FIG. 13, a groove 14 is formed with depth d on the surface of the P type substrate 11, and a dielectric layer 17 is made so as to cover an inner surface of groove 14 and a gate electrode 18 made of polysilicon is provided on a dielectric layer 17. The region of source 15 with a depth $X_{sj}$ and that of drain 16 with a depth $X_{dj}$ are formed by diffusing impurity of n type from the surface of the substrate 11 of the side of the groove 14. Upon them, a source electrode 19 and a drain electrode 20 are established. At this time, a depth of drain region $X_{sj}$ is formed so as to be represented by the formula $$X_{sj} \leq d - \sqrt{\frac{2\epsilon}{qN}} (\sqrt{|V_{SUB}| + V_B} - \sqrt{|V_{SUB}| + 2\phi_F}) \quad (1)$$

There is no doubt that the depth of the groove 14 is made sufficiently large as to prevent the value from becoming negative.

Where
$\epsilon$ = dielectric coefficient of silicon
N = concentration of impurity in silicon
$\phi_F$ = fermi level
$V_S$ = built-in electric field
q = elementary charge
$V_{SUB}$ = substrate voltage As shown in FIG. 13, a distance between a bottom face of P type substrate 11 and a bottom face of a source region 15 is represented by $X_{dj}$, and a distance between a bottom face of P type substrate 11 and a bottom face of a groove 14 is given by $X_{d2}$. We have $$X_{sj} + X_{d1} \leq d + X_{d2} \quad (2)$$

The depth $X_{sj}$ of diffusion of the source region 15 is given by the formula (3).

$$X_{sj} \leq d - X_{d1} + X_{d2} \quad (3)$$

It is well known that $$X_{d1} = \sqrt{\frac{2\epsilon}{qN} (|V_{SUB}| + V_B)} \quad (4)$$

$$X_{d2} = \sqrt{\frac{2\epsilon}{qN} (|V_{SUB}| + 2\phi_F)} \quad (5)$$

Substitution of (4) and (5) formula with (3), result in $$X_{sj} \leq d - \sqrt{\frac{2\epsilon}{qN}} (\sqrt{|V_{SUB}| + V_B} - \sqrt{|V_{SUB}| + 2\phi_F}) \quad (6)$$

Figure 14:
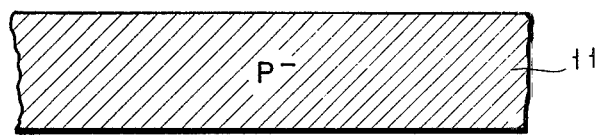
FIGS. 14 to 19 are drawings explaning the manufacturing processes of the device showin in FIG. 13.

In FIG. 13, the formation of the source and drain 15 and 16 may be made by a diffusion, ion implantation and any other methods and a groove may be formed by a chosen epitaxial process, besides the etching process. A manufacturing process of the device shown in FIG. 13 is explained in referring to the FIG. 14 to FIG. 19. In the process of FIG. 14, a substrate 11 of p− type of concentration of impurity about $10^{15}$/cm$^3$ is prepared.

Figure 15:
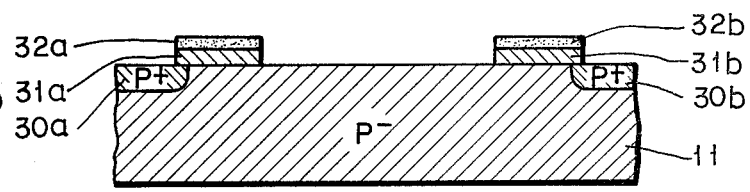
Figure 16:
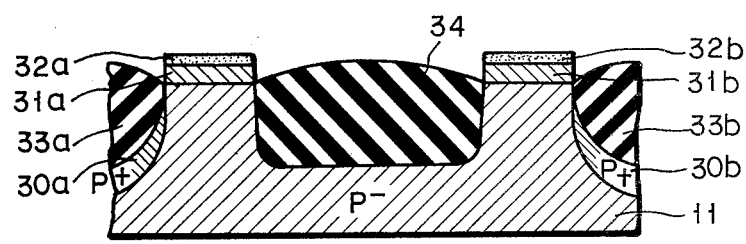
Figure 17:
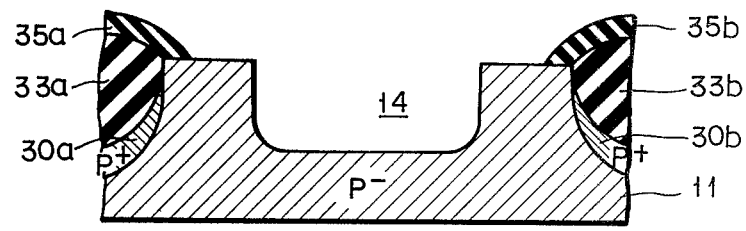
Figure 18:
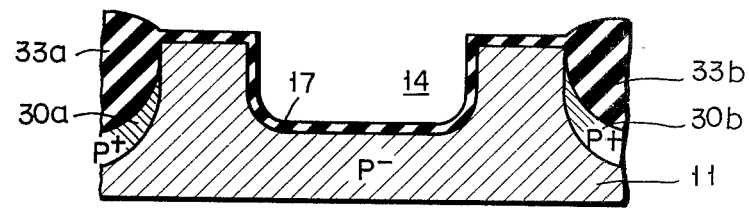
Figure 19:
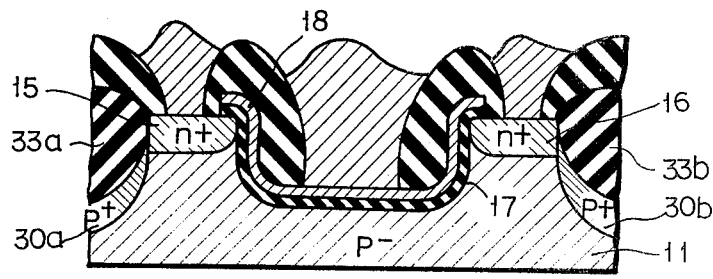

In the process of FIG. 15, oxide film layers 31a, 31b, and Si$_3$N$_4$ layers 32a and 32b are formed at prearranged positions of the source and drain, mutually separated by 2$\mu$ on the substrate 11, and on their outsides, P+ layers 30a and 30b of concentration about $10^{18}$/cm$^3$ for a field use are established. Moreover, after forming SiO$_2$ layers 33a, 33b and 34 of depth about 2.0$\mu$, by oxidation, in the process of FIG. 16, apply resists 35a and 35b in the process of FIG. 17 and remove SiO$_2$ layer 34 and thereby on the surface of the semiconductor substrate a groove of depth about 1.2$\mu$ is made. Remove resists 35a and 35b and form a SiO$_2$ layer 17 of thickness about 0.1$\mu$ in the process of FIG. 18. In the next process of FIG. 19, a gate electrode 18 of length 3.5$\mu$ consisting of polysilicon is formed on the layer of SiO$_2$ layer 17.

An impurity concentration of about $10^{19}$/cm$^3$ is obtained by diffusing impurities of n type at portion where part of oxide layers of SiO$_2$ 33a, 33b and 17 are removed, and a source region 15 and a drain region 16 are made in such a way that diffusing depth $X_{sj}$ from the surface of each region is approximately equal to 1.0$\mu$.

Hereafter, according to a conventional production process, prevention of deterioration is carried out by attachment of electrodes and a coating of PS$_i$ glass, and MOS transistors to be used under condition of $V_{SUB}$=OV are formed.

Figure 20:
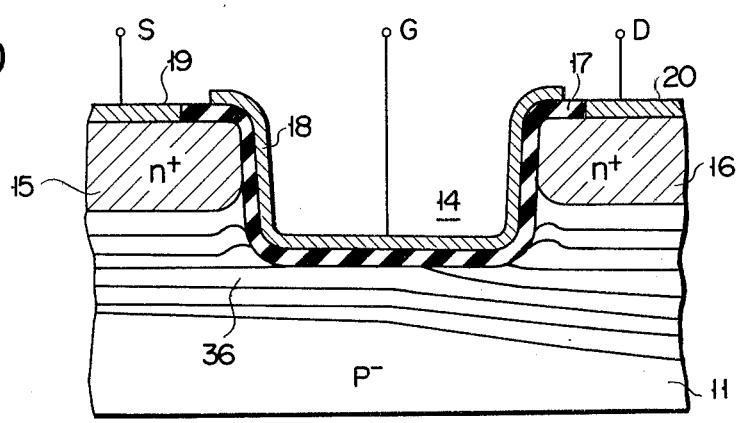
FIGS. 20 and 21 show distributions of equipotential lines in the device of FIG. 13.
Figure 21:
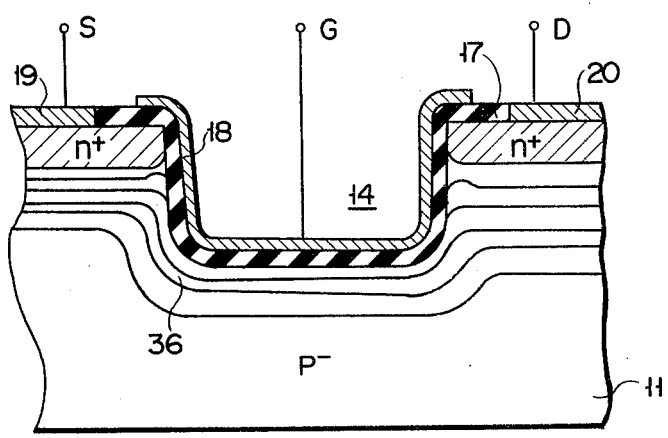

Schematic drawings of equipotential lines for the operation of an MOS transistor whose structure is given in FIG. 13, are shown in FIG. 20 and FIG. 21.

In FIG. 20, equipotential lines from a channel portion just under the groove 14 up to a portion right under the source 15 become parallel to the surface by regulating a depth of diffusion $X_{sj}$ of the source region 15. When a diffusion of the source 15 is deeper, equipotential lines near to the source 15 are lowered and become convex upward in the neighborhood of the groove 14 and a value of threshold voltage to be applied to the gate 18 becomes smaller resulting in the creation of a short channel effect. On the other hand, when a diffusion of the source 15 is shallower, a distribution of equipotential lines becomes like FIG. 21. At the source region 15, equipotential lines are drawn upward in opposite direction to the aforesaid.

Owing to this fact, a curve becomes convex downward at a source portion 36 near the groove 14.

A value of threshold voltage at this portion becomes greater than that of other portion of channel and it is hard to form a reversed layer. In order to make act switches by controlling current from the source region 15 to the drain region 16, a formation of a reversed layer at a starting portion of a channel plays an important role, so that it is obviously possible to obtain an element of a short channel showing the same stable value of threshold voltage as a transistor of a long channel by excluding a variation of values of threshold voltage due to a bending of an equipotential line near by the source region 15. Moreover, this structure prevents otherwise easy breakdowns between the source 15 and drain 16. It is not necessary to minimize too much $X_{dj}$ and $X_{sj}$, according to the embodiment, so technical difficulties such as heat treatment and penetration can be avoided and inconveniences such as an increase of surface resistances of the source and drain regions and a drop of break-down voltage etc. can be prevented. The embodiment shown in FIG. 13 is treated for the case of $X_{sj}=X_{dj}$.

The value of $X_{dj}$ may be established in such a way that it can prevent a threshold voltage from lowering, equipotential lines go straight on, and $X_{dj}$ is kept within a suitable range of values. MOS transistors of P channel can be composed in the same way as the above-mentioned MOS transistors of n channel. In the said embodiment, that is, the device of FIG. 13, a face constituting a channel of a bottom of the groove 14 and a face composing a channel of a side of the groove 14 become different crystal planes, respectively, for example, a (100) plane and a (111) plane.

A difference of electric characteristics between both faces may induce influences as harmful as a variation of values of threshold voltage, etc.

Embodiments mentioned below give small sized and high stable MOS transistors whose channel portions are limited only at the bottoms of the grooves.

Figure 22:
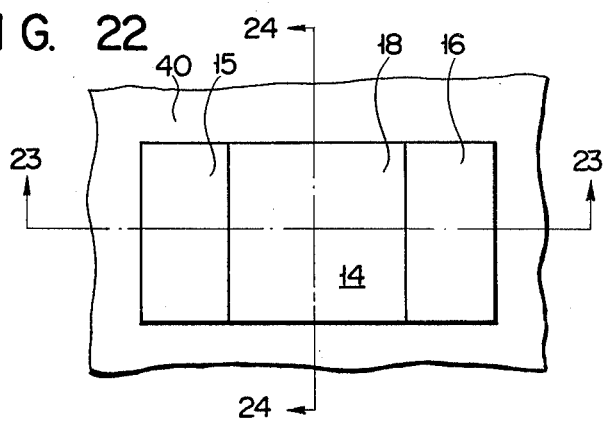
FIGS. 22 to 24 are respectively a plan, a longitudinal section and a cross section showing devices of further embodiments of the invention.
Figure 23:
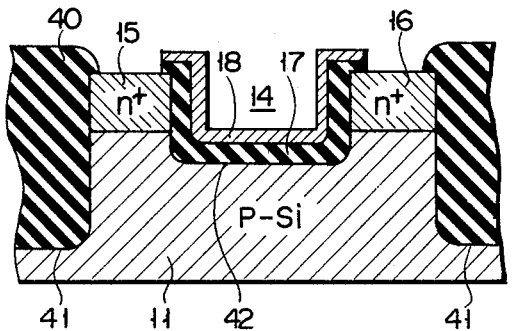
Figure 24:
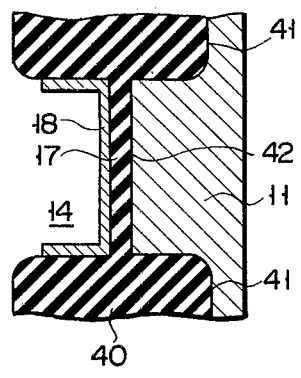
Figure 25:
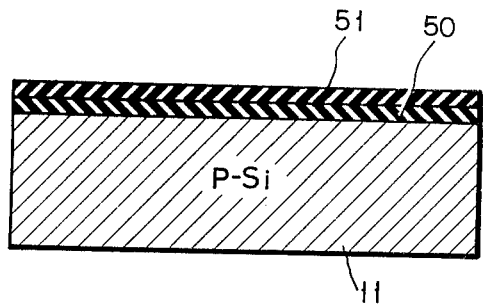
FIGS. 25 to 31 are illustration of manufacturing processes of devices shown in FIGS. 22 to 24.

FIG. 22 to FIG. 24 show respectively a top view and cross sectional views of a MOS transistor based on the above-mentioned ideas. Parts similar to those of the embodiments above-mentioned have the same reference numerals.

An insulating layer of heavy thickness for field use 40 is formed so as to enclose the MOS transistor composed of a source region 15, drain region 16, a gate insulating layer 17 and a gate electrode 18.

Hereupon, the deepest portion 41 of the boundary surface between the insulating layer for field use 40 and semiconductor substrate 11 is located more deeply than the face 42 forming the channel under the gate. The device shown in FIG. 22 to FIG. 24 as embodiment is manufactured through the process shown in FIGS. 25 to 31.

First of all, a laminate film is composed of $SiO_2$ layer 50 and $Si_3N_4$ layer 51 applied on a surface of Si substrate 11 of P type with concentration of impurity about $10^{15}/cm^3$.

Figure 26:
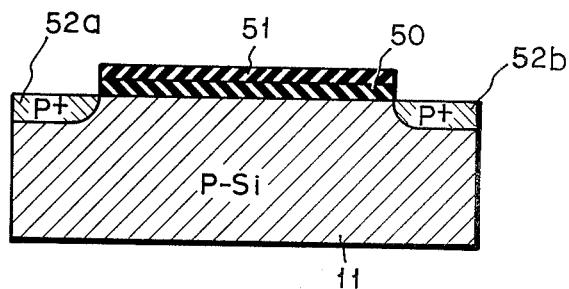

Next, at the process of FIG. 26, this laminate film is removed at an appointed portion a formation of an insulating layer, and a P+ type layer 52a and 52b having concentration of impurity of about $10^{18}/cm^3$ is formed by diffusion.

Figure 27:
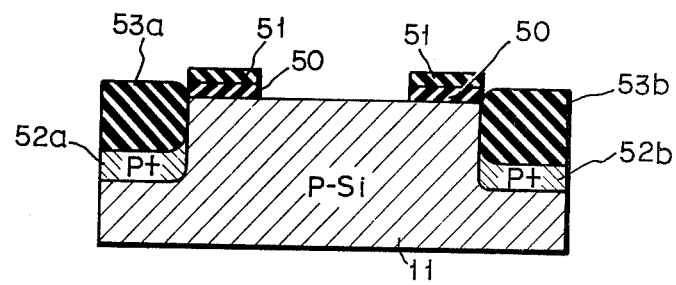

Moreover, at the process of FIG. 27, after oxidizing the surface of the substrate 11 and forming the oxide layer 53a and 53b of thickness about 1.5μ at the field area, remove the gate portion of the said laminate film 50 and 51 by etching.

Figure 28:
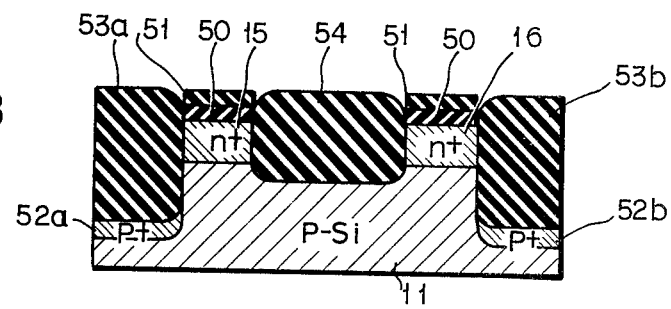
Figure 29:
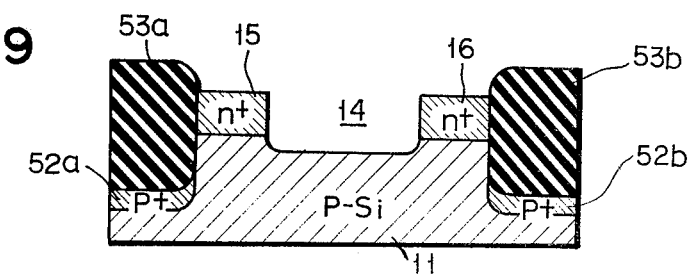

Next, at the process of FIG. 28 form an oxide layer 54 with thickness about 2μ at the gate portion by oxidizing as a whole, and then inject phosphorus, for example, through the laminate film by ion implantation method, in order to make a source region of n+ type 15 and a drain region 16 of thickness about 0.8 μm with concentration of impurity about $10^{19}/cm^3$.

Thereafter, leave oxide layers 53a and 53b in the area of field as they are, and remove an oxide layer 54 at the gate region and the laminate films 50 and 51 above the source and drain regions 15 and 16. Next, in the process of the FIG. 29, the groove 14 of width about 2μ and depth about 1.2μ is formed by etching of oxide layer 54.

Figure 30:
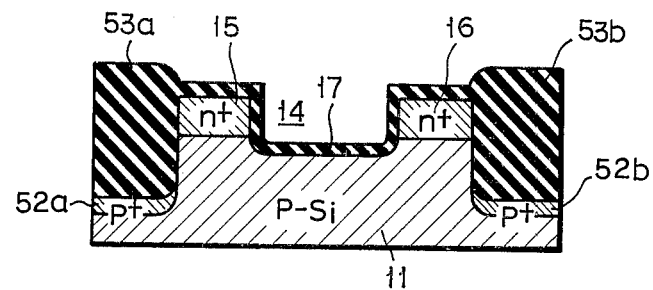

Thereafter, a gate oxide layer 17 of thickness about 0.1μ is formed in the process shown in FIG. 30, by a conventional manufacturing process of polycrystal silicon gate MOS transistors.

Figure 31:
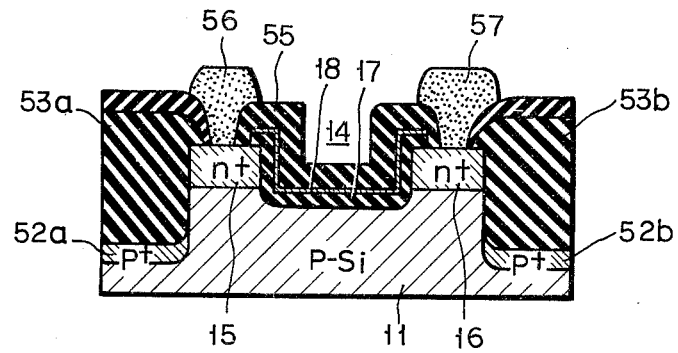

In succession, through the process shown in FIG. 31, provide a gate electrode of polycrystal silicon, and after patterning, cover the whole surface with the oxide layer 55 by chemical vapor deposition process and open a contact hole and then evaporate Al and form contact electrodes 56 and 57 of the source and drain regions by patterning, and also, form contact electrodes of the gate (not indicated by figure), outside of transistor domain to complete the work.

In the MOS transistor thus fabricated, the interface between the oxide film 40 in a field area (FIGS. 22 to 24) and the substrate 11 is made so as to be situated under the channel 42 of the bottom of the groove 14; therefore, the channel is made only at the bottom of the groove 14, as shown clearly in FIG. 24, and not at the side of the channel. This permits formation of an MOS transistor having a sufficiently small width of channel. The MOS transistor as a practical embodiment is suitable for a transistor of a static RAM, for example, which requires a sufficiently small conductance in view of electric power consumption. Since the channel is formed on the crystal face, for example, the face (100) which exists at the bottom of the groove 14, other faces, having different electric characteristics and threshold values, are not involved; therefore, the characteristic of the MOS transistor is kept in good condition. Because of making the oxide layer of the field portion 40 sufficiently thick, protection of a field portion from a reversal is a big merit.

According to the structure of the MOS transistor shown in this practical embodiment, a P-N junction between the source 15 and drain 16 of n type and the substrate of P type intersects the interface between semiconductor substrate and oxide layer at an angle nearby a right angle, so a voltage-proof of breakdown can be obtained at the p-n junction and an instability of a value of threshold voltage due to a short channel effect can be avoided.

In the practical embodiment of FIGS. 22 to 24, the p-n junction is made so as to be above the interface between the semiconductor of the gate domain and insulator, but even if it is made to be little under the interface, a sufficient effectiveness may be obtained, under a condition that an interface between a base plate in a domain of a surrounding field and an insulating layer is made to occupy a subordinate position in comparison with a channel portion. The same embodiment shows the case of MOS transistor of P channel.

Figure 32:
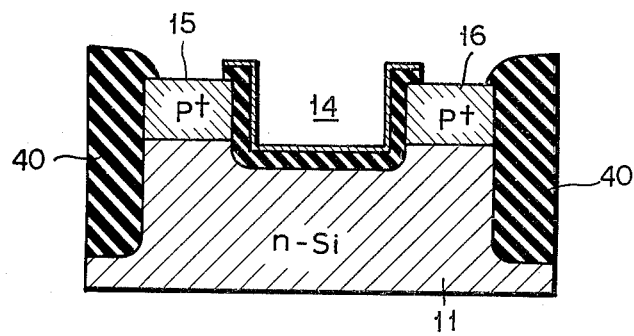
FIGS. 32 and 33 are cross sectional views showing modified embodiments of the devices shown in FIGS. 22 to 24.

As the FIG. 32, a same composition can be obtained by using a Si substrate of n type, and moreover, this structure is applicable to constituent elements of an MOS transistor of Bucket Brigade Device (BBD) and is able to control a variation of a value of threshold voltage due to a short channel effect.

This structure improves also the efficiency of electric charge transfer and is useful for an improvement of the break down voltage.

Figure 33:
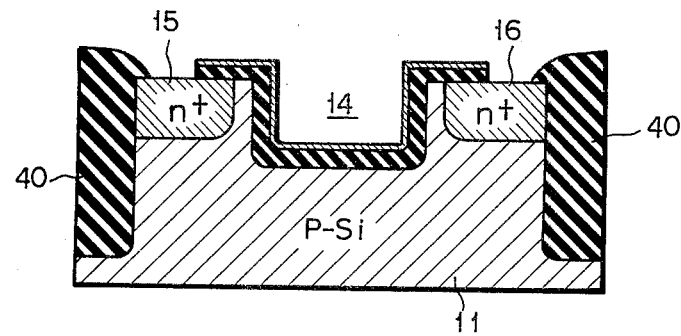

Moreover, as shown in FIG. 33, even if the structure is composed so as to make lie a portion of the substrate 11 among the source region 15, a drain region 16 and a groove 14 of channel portion, without making it be adjacent to them, a sufficient effect may be obtained.

What we claim is:

1. A semiconductor device comprising a semiconductor substrate of one conductivity type, a source region and a drain region of opposite conductivity type separately provided on the semiconductor substrate to form a conductive channel therebetween, a U-shaped groove provided above said channel between the source and drain regions, said U-shaped groove having side walls of depth d and having a base of breadth L substantially parallel to the direction of said channel, said semiconductor device further having an insulating layer on said groove and a gate electrode installed above the channel on said insulating layer, wherein a depth $X_{sj}$ of said source region is selected to be calculated by the following formula, $$X_{sj} \leq d - \sqrt{\frac{2\epsilon}{qN}} \left( \sqrt{|V_{SUB}| + V_B} - \sqrt{|V_{SUB}| + 2\phi_F} \right)$$

where
d = depth of groove
$\epsilon$ = dielectric coefficient of silicon
N = concentration of impurity of silicon
$\phi F$ = Fermy level
$V_B$ = built-in electric field
$V_{SUB}$ = voltage of said substrate, and
q = elementary charge, 2. A semiconductor device comprising:
a semiconductor substrate of one conductivity type having a flat surface;
a pair of semiconductor regions of lower conductivity than the conductivity of said substrate, said semiconductor regions being separately provided on said flat surface of said semiconductor substrate, said regions each having a side wall positioned perpendicular to said flat surface and said walls being positioned parallel to each other to define therebetween a U-shaped groove having a base portion defined by a portion of said flat surface, said U-shaped groove forming a conduction channel at said portion of said flat surface of said semiconductor substrate, said semiconductor regions also having bottom surfaces lying in substantially the same plane as that in which said portion of said flat surface is included;
source and drain regions both of opposite conductivity type to said substrate and of greater conductivity than said semiconductor regions formed in one and the other of said pair of semiconductor regions, said source and drain regions being separated from said substrate by said semiconductor regions and from each other by said U-shaped groove between them sufficiently to prevent creation of a short channel effect;
a gate-insulating layer provided on the inner surfaces of said U-shaped groove and;
a controlling electrode provided in said U-shaped groove on said gate-insulating layer.

3. A semiconductor device of claim 2 further including a field-insulating film formed in said substrate and surrounding said U-shaped groove and said pair of semiconductor regions, said field-insulating film being contiguous to said pair of semiconductor regions, the bottom of said field insulating film extending lower into said substrate than said base portion of said U-shaped groove.

4. A semiconductor device according to claim 2, wherein said pair of semiconductor regions are formed to have the opposite conductivity type to said substrate with very low concentration of impurity.

5. A semiconductor device according to claim 2 wherein said pair of semiconductor regions are formed of intrinsic semiconductor layers.

6. A semiconductor device according to claim 3 wherein a P+ layer is provided between the lowest part of said field insulating film and said substrate, and said substrate is of P type Si.

7. A semiconductor device of claim 2 wherein said source and drain regions extend to surfaces of said side walls.

8. A semiconductor device comprising:
a semiconductor substrate of one conductivity type having a flat surface;
a pair of intrinsic semiconductor layers separately provided on said flat surface of said semiconductor substrate, said layers each having a side wall positioned perpendicular to said flat surface and said walls being positioned parallel to each other to define therebetween a U-shaped groove having a base portion defined by a portion of said flat surface, said U-shaped groove forming a conduction channel at said portion of said flat surface of said semiconductor substrate, said semiconductor layers also having bottom surfaces lying in substantially the same plane as that in which said flat surface of said substrate is included;
source and drain regions both of opposite conductivity type to said substrate formed on one and the other of said pair of intrinsic semiconductor layers, respectively, in such a manner that said source and drain regions extend to surfaces of said side walls to define portions of said side walls, said source and drain regions being separated from said substrate by said intrinsic semiconductor layers and from each other by said U-shaped groove between them sufficiently to prevent creation of a short channel effect;
a gate-insulating layer provided on the inner surfaces of said U-shaped groove; and
a controlling electrode provided in said U-shaped groove on said gate-insulating layer.

9. A semiconductor device comprising:
a semiconductor substrate of one conductivity type having a flat surface;
a pair of semiconductor layers having a resistance higher than that of said substrate separately provided on said flat surface of said semiconductor substrate, said layers each having a side wall positioned perpendicular to said flat surface and said walls positioned parallel to each other to define there between a U-shaped groove having a base portion defined by a portion of said flat surface, said U-shaped groove forming a conduction channel at said portion of said flat surface of semiconductor substrate, said semiconductor layers also having bottom surfaces lying in substantially the same plane as that in which said flat surface of said substrate is included;
source and drain regions both of opposite conductivity type to said substrate and of less resistance than said semiconductor layers formed on one and the other of said pair of semiconductor layers, respectively, in such a manner that said source and drain regions extend to surfaces of said side walls to define portions of said side walls;

a gate-insulating layer provided on the inner surfaces of said U-shaped groove; and a controlling electrode provide in said U-shaped groove on said gate-insulating layer.

10. A semiconductor device according to claim 9 wherein said semiconductor layers are of n-type and said substrate is of p type.

11. A semiconductor device according to claim 9 wherein said semiconductor layers are of p-type and said substrate is of n type.

12. A semiconductor device according to claim 9 wherein the thickness of said semiconductor layer adjacent to said source region is formed so as to be thinner than the thickness of said semiconductor layer adjacent to said drain region.

* * * * *